United States Patent
Anderson et al.

(10) Patent No.: US 7,475,308 B2
(45) Date of Patent: Jan. 6, 2009

(54) IMPLEMENTING DETERMINISTIC BASED BROKEN SCAN CHAIN DIAGNOSTICS

(75) Inventors: Adrian C. Anderson, Lagrangeville, NY (US); Todd Michael Burdine, Wappingers Falls, NY (US); Donato Orazio Forlenza, Hopewell Junction, NY (US); Orazio Pasquale Forlenza, Hopewell Junction, NY (US); William James Hurley, Poughkeepsie, NY (US); Phong T. Tran, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/101,925

(22) Filed: Apr. 11, 2008

(65) Prior Publication Data
US 2008/0189583 A1    Aug. 7, 2008

Related U.S. Application Data

(63) Continuation of application No. 10/821,160, filed on Apr. 8, 2004, now Pat. No. 7,395,469.

(51) Int. Cl.
*G01R 31/28* (2006.01)
(52) U.S. Cl. ............................ 714/726; 714/738
(58) Field of Classification Search .......... 714/724–739
See application file for complete search history.

(56) References Cited

U.S. PATENT DOCUMENTS

| 5,951,703 | A  | 9/1999  | Sprouse et al.  |
| 6,385,750 | B1 | 5/2002  | Kapur et al.    |
| 6,618,826 | B1 | 9/2003  | Chen et al.     |
| 6,662,327 | B1 | 12/2003 | Rajski          |
| 6,807,646 | B1 | 10/2004 | Williams et al. |
| 6,950,974 | B1 | 9/2005  | Wohl et al.     |
| 6,993,694 | B1 | 1/2006  | Kapur et al.    |
| 2003/0131294 | A1 | 7/2003 | Motika et al.  |
| 2004/0003329 | A1 | 1/2004 | Cote et al.    |

OTHER PUBLICATIONS

Guo et al., "A Technique for Fault Diagnosis of Defects in Scan Chains", IEEE, paper 10.2 2001, pp. 268-277, USA.
Sarrica et al., Theory and Implementation of LSSD Scan Ring & Stumps Channel Test and Diagnosis, 1992, IEEE/ CHMT Int'l Electronics Manufacturing Symposium, pp. 195-201.

*Primary Examiner*—Cynthia Britt
(74) *Attorney, Agent, or Firm*—Joan Pennington (57) ABSTRACT

A method, apparatus and computer program product are provided for implementing deterministic based broken scan chain diagnostics. A deterministic test pattern is generated and is loaded into each scan chain in the device under test using lateral insertion via system data ports applying system clocks. Then each scan chain is unloaded and a last switching latch is identified. The testing steps are repeated a selected number of times. Then checking for consistent results is performed. When consistent results are identified, then the identified last switching latch is sent to a Physical Failure Analysis system.

7 Claims, 7 Drawing Sheets

| | | | | | | | | | |
|---|---|---|---|---|---|---|---|---|---|
| 1st PATTERN | 0 | 0 | 0 | 0 | 0 | 1 | 1 | 1 | 1 | 1 |
| 2nd PATTERN | 1 | 1 | 1 | 1 | 1 | 0 | 0 | 0 | 0 | 0 |
| 3rd PATTERN | 0 | 0 | 0 | 0 | 0 | 1 | 1 | 1 | 1 | 0 |
| 4th PATTERN | 0 | 0 | 0 | 0 | 0 | 1 | 1 | 1 | 0 | 1 |
| 5th PATTERN | 0 | 0 | 0 | 0 | 0 | 1 | 1 | 0 | 1 | 1 |
| 6th PATTERN | 0 | 0 | 0 | 0 | 0 | 1 | 0 | 1 | 1 | 1 |
| 7th PATTERN | 0 | 0 | 0 | 0 | 0 | 0 | 1 | 1 | 1 | 1 |
| 8th PATTERN | 0 | 0 | 0 | 0 | 1 | 1 | 1 | 1 | 1 | 1 |
| 9th PATTERN | 0 | 0 | 0 | 1 | 0 | 1 | 1 | 1 | 1 | 1 |
| 10th PATTERN | 0 | 0 | 1 | 0 | 0 | 1 | 1 | 1 | 1 | 1 |
| 11th PATTERN | 0 | 1 | 0 | 0 | 0 | 1 | 1 | 1 | 1 | 1 |
| 12th PATTERN | 1 | 0 | 0 | 0 | 0 | 1 | 1 | 1 | 1 | 1 |

IMPLEMENTING DETERMINISTIC BASED BROKEN SCAN CHAIN DIAGNOSTICS

This application is a continuation application of Ser. No. 10/821,160 filed on Apr. 8, 2004 now U.S. Pat. No. 7,395,469.

FIELD OF THE INVENTION

The present invention relates generally to the field of testing integrated circuits, and more particularly, relates to a method, apparatus and computer program product for implementing deterministic based broken scan chain diagnostics.

DESCRIPTION OF THE RELATED ART

A continuing problem for VLSI testing is how to diagnose an exact location of broken scan chain or chains. When there is low or zero yield, the scan chains are often broken so that the only opportunity to learn and diagnose the root cause of the problem is defect localization based upon scan chain failure data. Other test applications, such as, Level Sensitive Scan Design (LSSD), Logic Built In Self Test (LBIST), Array Built In Self Test (ABIST), functional, Design-For-Test (DFT) and Design-For-Diagnostics (DFD), all assume the scan chains are operational.

The problem of a broken scan chain or chains is usually encountered early in a technology life cycle and diagnostics is critical in improving the fabrication process so that manufacturing yield levels can be quickly achieved. An inability to improve the technology and yield can greatly impact a program or at least severely minimize the revenue that could be realized.

Rapid diagnosis to a location for Physical Failure Analysis (PFA) is needed to understand and correct process anomalies. In these low or zero yield situations, the most common failure is often the scan chain. The LSSD Flush and Scan tests will fail when there is one or more broken scan chains on a device. In these cases, there is no operating region where the scan chains are functional. Since all other tests utilize the scan chain to perform device tests, diagnostics of the broken scan chain or scan chains with hard DC flush and scan fails is extremely limited. Also as the density of VLSI devices continue to increase, their respective scan chains will continue to increase in size proportionally and thus, this problem will become even more severe. Fault simulation/test generation, providing extremely vital tools for diagnosing combinational faults, is very inefficient and ineffective for shift register (SR) diagnostics. Hence, a solution is needed which speeds broken scan chain diagnostics on the majority of the failing devices to enable timely process corrections and yield improvements.

Existing methods and approaches to this problem include dumping megafail data on the tester, Automatic Test Pattern Generation (ATPG) directed at each hypothetical broken latch, voltage and timing sensitive methods, IDDQ walk current measurements, power up/down techniques, and LBIST/ABIST engine based techniques. Significant drawbacks are that the known solutions require very large data volumes, extremely long simulation times, and are not always 100% reliable, and further not one single known method is always successful all the time. This can be attributed to the nature of the particular fault and its manifestation, complex faults, and that faults are not limited to the type of chip area that propagates to system paths of the broken latch or latches whether it originates from combinational logic or array outputs.

A need exists for fast and efficient techniques that diagnose defects in broken scan chain or chains and that provide a defect location for Physical Failure Analysis (PFA).

SUMMARY OF THE INVENTION

Principal aspects of the present invention are to provide a method, apparatus and computer program product for implementing deterministic based broken scan chain diagnostics. Other important aspects of the present invention are to provide such method, apparatus and computer program product for implementing deterministic based broken scan chain diagnostics substantially without negative effect and that overcome many of the disadvantages of prior art arrangements.

In brief, a method, apparatus and computer program product are provided for implementing deterministic based broken scan chain diagnostics. A deterministic test pattern is generated and is loaded into each scan chain in the device under test using lateral insertion via system data ports applying system clocks. Then each scan chain is unloaded and a last switching latch is identified. The testing steps are repeated a selected number of times. Then checking for consistent results is performed. When consistent results are identified, the identified last switching latch is sent to a Physical Failure Analysis system.

In accordance with feature of the invention, when consistent results are not identified, then another deterministic test pattern is used and then the testing steps are repeated a selected number of times. The deterministic test pattern can be generated from a base deterministic test pattern set generated by an Automatic Test Pattern Generation (ATPG) system. The deterministic test pattern can be generated using perturbations of one base deterministic test pattern from the base deterministic test pattern set. The deterministic test pattern can be generated using a software Pseudo Random Pattern Generator (PRPG).

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method is provided that utilizes one or more deterministic test patterns for diagnosing broken scan chains. Diagnosing broken scan chains is accomplished by this novel method that efficiently generates a self-contained and exhaustive diagnostic test pattern set of the deterministic test patterns that can sensitize and pinpoint the exact defective latch within a broken scan chain.

Figure 1:
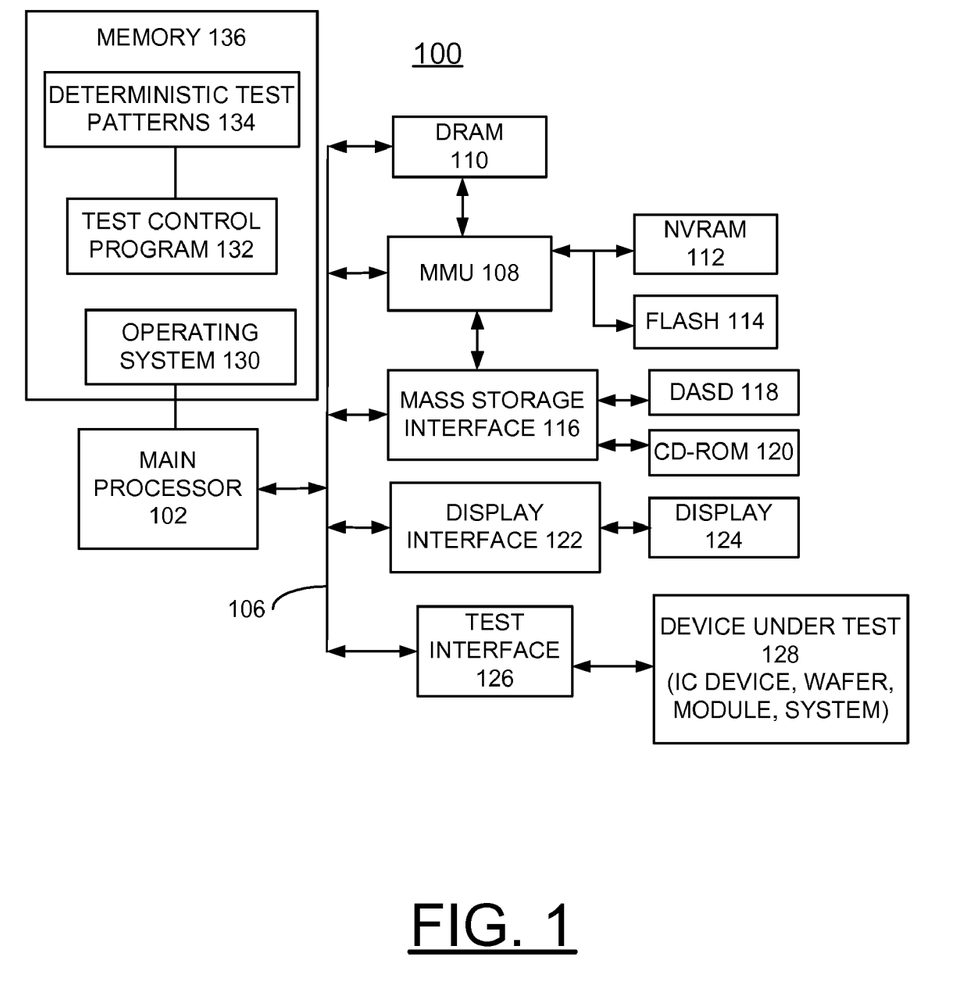
FIG. 1 is a block diagram representations illustrating an exemplary computer test system for implementing deterministic based broken scan chain diagnostics in accordance with the preferred embodiment.

Referring now to the drawings, in FIG. 1 there is shown an exemplary computer test system generally designated by the reference character 100 for implementing deterministic based broken scan chain diagnostics in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 connected to a display 124, and a test interface 126 coupled to the system bus 106. A device under test 128 is coupled to the test interface 126. The device under test 128 includes, for example, an integrated circuit wafer, a module, or a system. Computer system 100 includes an operating system 130, a test control program 132, and a set of deterministic test patterns 134 of the preferred embodiment resident in a memory 136.

Computer test system 100 is shown in simplified form sufficient for understanding the present invention. The illustrated computer test system 100 is not intended to imply architectural or functional limitations. The present invention can be used with various hardware implementations and systems and various other internal hardware devices, for example, multiple main processors.

Figure 2:
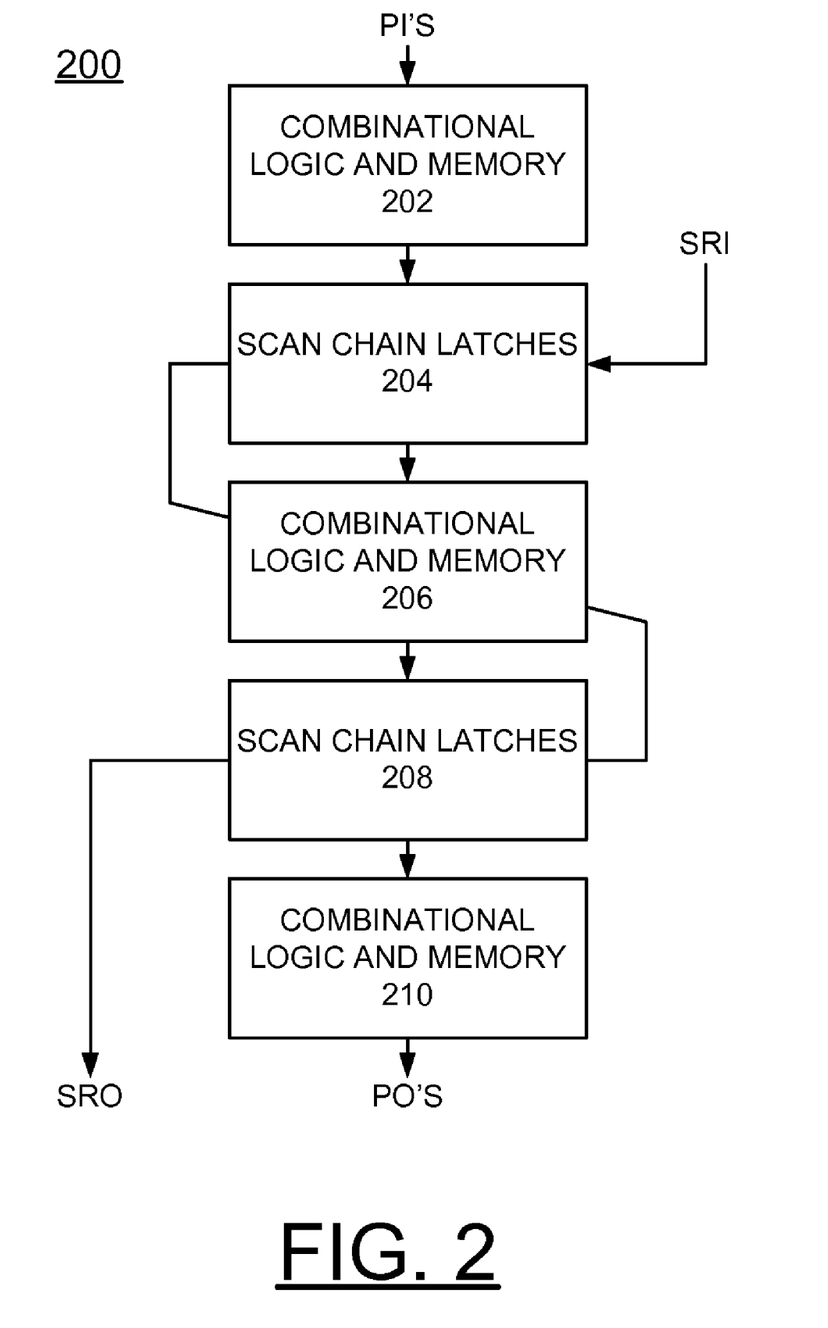
FIGS. 2 and 3 are block diagrams of exemplary scan chain arrangements for use in accordance with the preferred embodiment.
Figure 3:
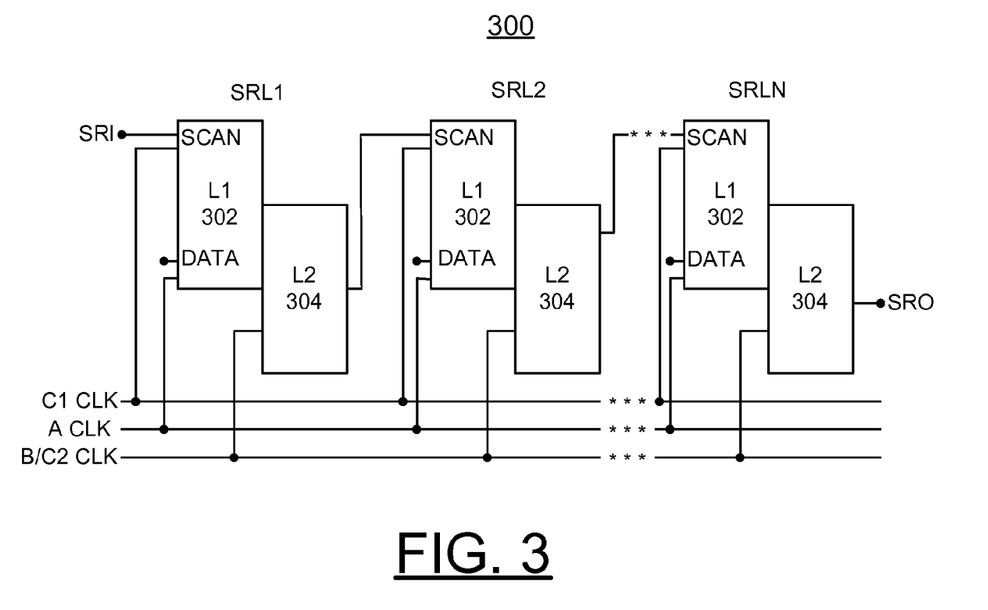

Referring now to FIGS. 2 and 3, there are shown exemplary scan chain arrangements generally designated by the reference characters 200, 300 for use in accordance with the preferred embodiment. The LSSD methodology is a system design and a Design-For-Test (DFT) approach that incorporates several basic test concepts including a scan design.

FIG. 2 illustrates a typical LSSD configuration 200 including a first combinational logic and memory block 202 having applied primary inputs (PIs) and coupled to a first scan chain latches block 204. A second combinational logic and memory block 206 receives primary outputs (POs) from the first scan chain latches block 204 and is coupled to a second scan chain latches block 208. The second scan chain latches block 208 is coupled to a third combinational logic and memory block 210. In the typical LSSD configuration 200 most of the storage elements of the device, such as latches or registers are concatenated in one or more scan chains 204, 208 and can be externally accessible via one or more serial inputs (SRI) and outputs (SRO). Storage elements that are not in this category are usually memory or other special macros that are isolated and tested independently. The LSSD design methodology ensures that all logic feedback paths are gated by one or more of the storage elements, thereby simplifying a sequential design into subsets of combinational logic sections.

FIG. 3 illustrates a typical LSSD scan chain 300 including a chain of Shift Register Latches (SRLs), SRL1-SRLN, each including a master latch L1, 302 and a slave latch L2, 304. The master latch L1, 302 has a pair of data ports SCAN and DATA, that may be captured by the latch responsive either to a first scan clock A CLK or a first functional system clock C1 CLK. The slave latch L2, 304 captures the value stored in the master latch L1, 302 responsive to either a second scan clock B CLK or a second functional system clock C2 CLK. As shown in FIG. 3, the second scan clock B CLK and the second functional system clock C2 CLK are combined as a single clock signal B/C2 CLK. The second scan clock B CLK and the second functional system clock C2 CLK are typically driven out of phase with both the first scan clock A CLK and the first functional system clock C1 CLK applied to the master latch L1, 302.

The strategy of diagnosing LSSD circuits has been established and evolving for many years. The characteristic of deterministic or predetermined LSSD patterns is that each pattern is independent from every other pattern. A pattern consists of a Load, primary inputs (PIs), Clocks, and an Unload sequence. Devices may have thousands of patterns depending upon the size and structure of the logic. During diagnostics, the failing pattern is identified and fault simulation is performed on the failing pattern, Load, PIs, Clocks, and Unload sequence. The circuit states can be quickly achieved by reviewing and simulating the failing pattern load, any PIs/Clocks, and measures. Previous passing patterns may also be used to eliminate potential faults that the identified failing pattern marked as potential candidates.

In accordance with features of the invention, the deterministic test function is used in a lateral broadside insertion manner across all latch system data ports and efficiently analyze the response data such that switching and non-switching latches are readily identified with the next to last non-switching latch being the point of the break within the defective scan chains. This comprehensive latch perturbation in conjunction with interactive diagnostic algorithms is used to identify and pinpoint the defective location in the broken scan chain. The LSSD scan A, B clocks and system C1, C2 clocks are assumed to be functional. This deterministic test function and ultimately deterministic test patterns derived thereof, can take on different forms and origins, some external to product and some internal to product. Four embodiments of the basic concept are provided depending upon the level of test generation support from the specific design structure.

While the invention is described with respect to LSSD scan design, it should be understood that this method generally is applicable to any other general scan design.

In accordance with features of the invention, a deterministic pattern set and functions are used to generate broken scan chain diagnostic patterns. For example, upon loading the scan chains it is clear to see that a stuck-at-1 fault causes the remainder of the associated scan chains to be also stuck-at-1. Upon pulsing the system clocks C1 CLK and C2 CLK, system data is clocked in broadside via the system data ports of the latches within the scan chains of the device under test 128. Subsequently, the scan chains are then unloaded and the scan chain internal states are analyzed by tester resident software that identifies the latch at which the deterministic data stops and the stuck-at-0 or stuck-at-1 data begin. This unload data can also be compared against known correct reference unload data, if available. Comparing expected results from a good reference device with the bad device helps narrow down or localize where the fault occurs and thus, greatly improves the accuracy of the diagnostic call. In addition, executing a large number of deterministic test patterns, for example, 100 tester loops across unique clocking sequences or base pattern sets also provides improved diagnostic granularity. The exact number of deterministic patterns to be applied can also be arrived at empirically on a design-by-design basis. The more deterministic test patterns applied resulting in the last switching latch to be reported as common mode provides even greater confidence of the diagnostic call. In some embodiments, deterministic test patterns are generated on-the-fly to easily and efficiently sensitize, capture, and ultimately observe the defect.

Figure 4:
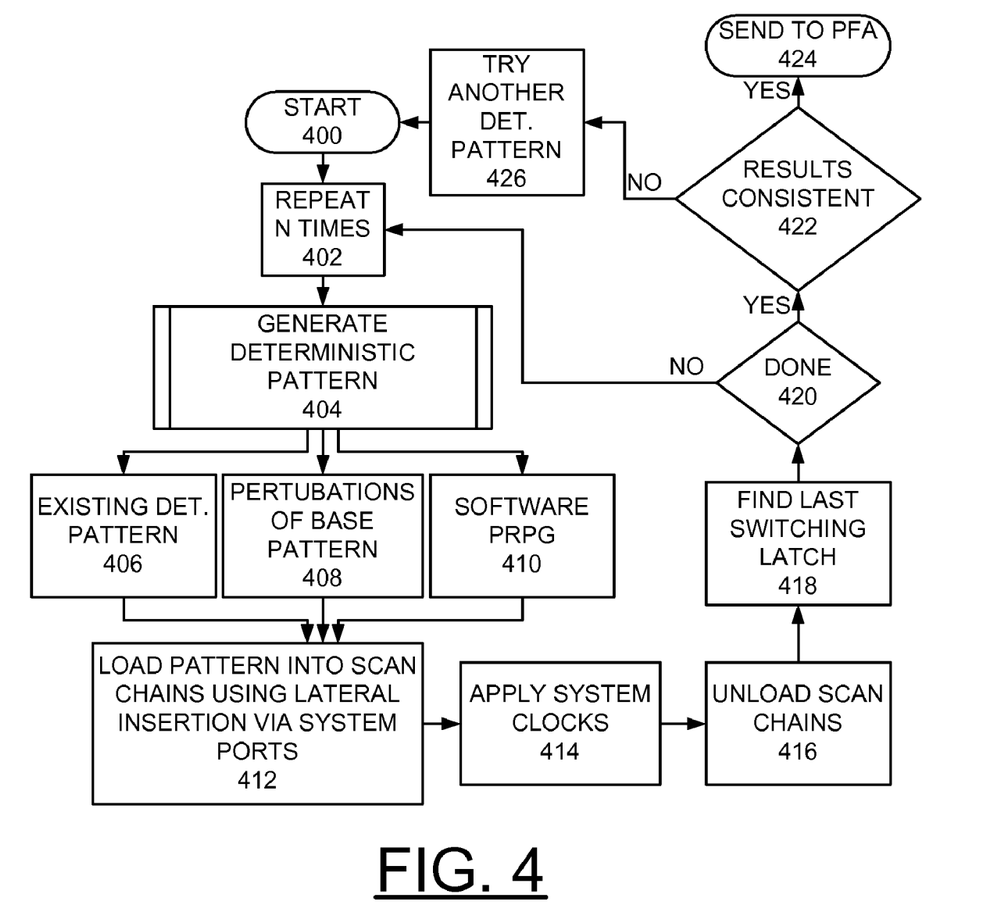
FIG. 4 is a flow chart illustrating exemplary steps for implementing deterministic based broken scan chain diagnostics in accordance with the preferred embodiment.

Referring now to FIG. 4, there are shown exemplary steps for implementing deterministic based broken scan chain diagnostics in accordance with the preferred embodiment starting at a block 400 and repeated a selected number N of times as indicated at a block 402. A deterministic test pattern is generated as indicated at a block 404.

As indicated at a block 406, a first embodiment utilizes an existing base deterministic test pattern set (LSSD Test Mode) that is generated by an available ATPG system. The implementation is the simplest of the three cases in that the diagnostic test patterns exist and reside at the test system for effortless application to product. However, this diagnostic pattern set may not be sufficient to expose the broken latch defect. Deterministic values applied to either the scan chain inputs (SRIs) or Primary Inputs (PIs) then are used with appropriate clocking to be captured into the latches SRLs. Then the scan chain, for example, scan chain latches blocks 204, 208 are unloaded and a particular latch where the defect occurs can be determined.

As indicated at a block 408, a second embodiment uses perturbations of a single base deterministic test pattern from the same ATPG system. Note that there can potentially be as many base deterministic test patterns as there are unique deterministic test sequences with unique clocking present on available test manufacturing data (TMD). These perturbations can include numerous algorithms that are both very flexible, and very easy to efficiently generate. Some algorithms are as follows: no invert, all invert, Nth bit invert, rotate, invert rotate, and combinations thereof. These algorithms can be performed upon each base deterministic test pattern thereby providing an ample, sufficient, and exhaustive supply of diagnostic test patterns that are necessary to both sensitize and manifest the defect within the broken scan chain or scan chains.

Figure 5:
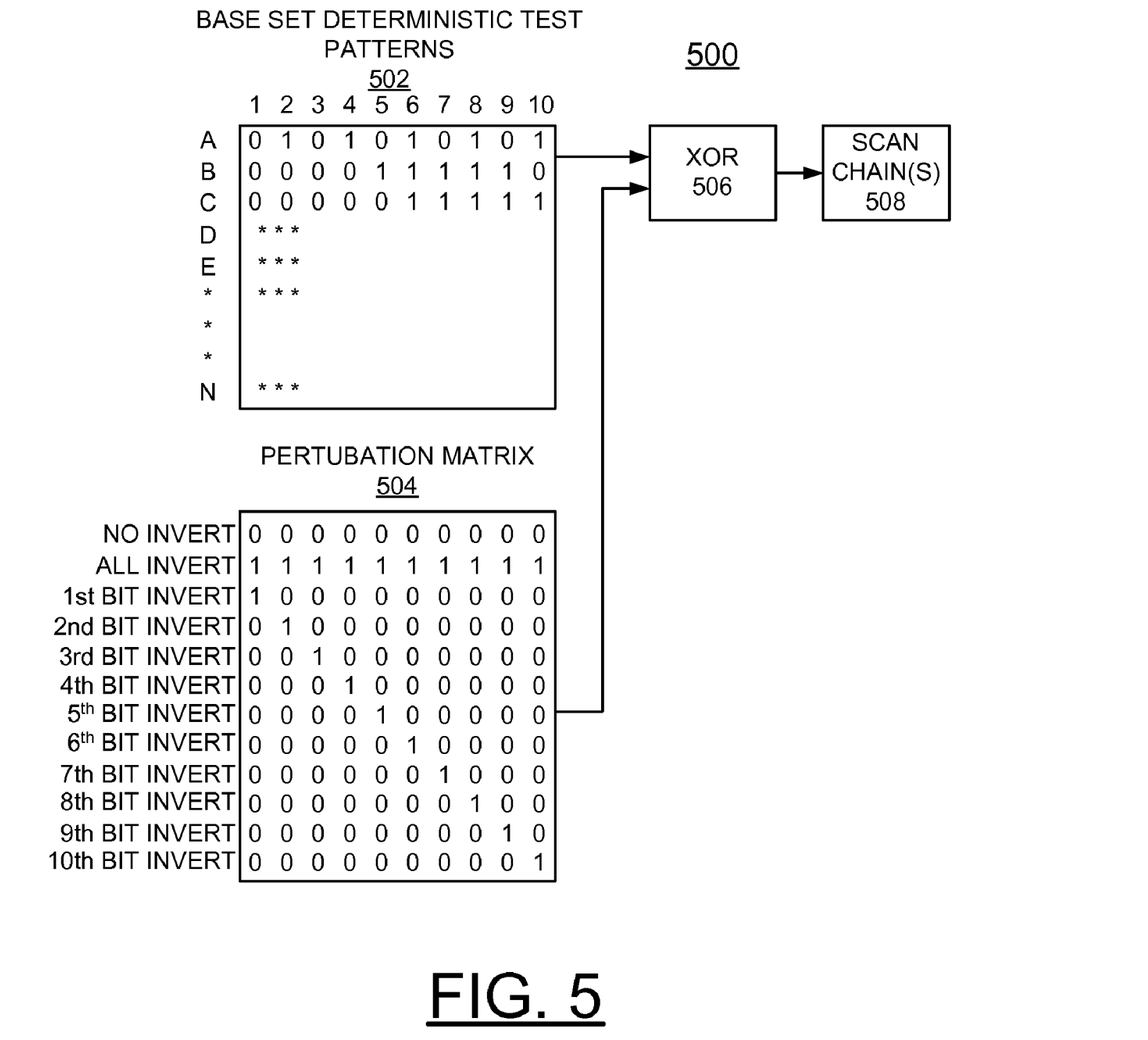
FIGS. 5 and 6 are diagrams illustrating exemplary deterministic pattern generation for implementing deterministic based broken scan chain diagnostics in accordance with the preferred embodiment.

Referring also to FIG. 5, for example, a base set of deterministic vectors and a perturbation matrix efficiently enables variations of this base set of deterministic patterns. FIG. 5 illustrates a base set of deterministic pattern vectors 502 in conjunction with a perturbation matrix 504 that are applied to an exclusive OR (XOR) 506 to automatically generate diagnostic broken scan chain patterns applied to scan chains as indicated at a block 508. This can be performed by tester resident software at the test system itself and even be applied concurrently so as to minimize data volumes.

Figure 6:
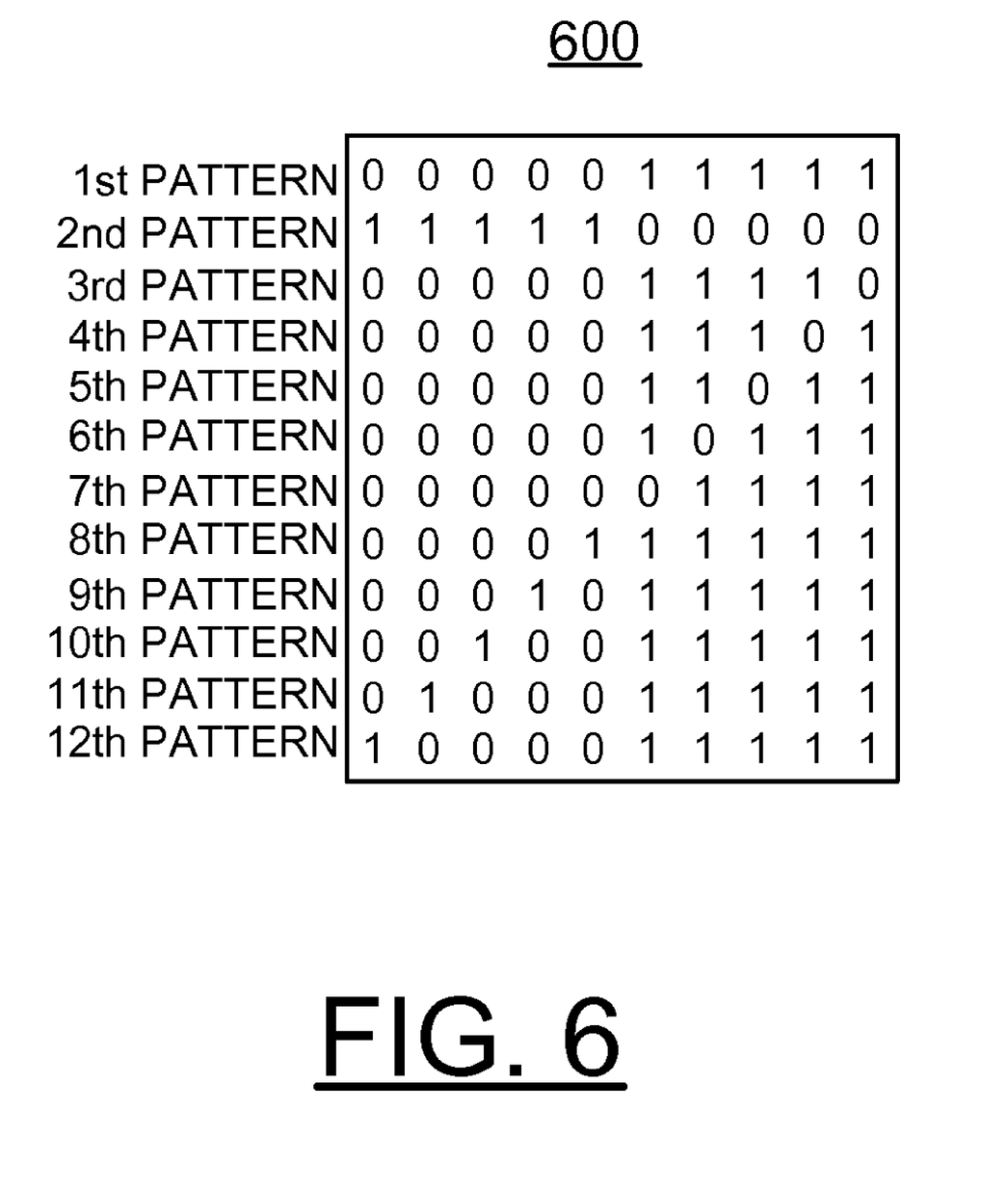

Referring also to FIG. 6, there is shown a sample of a set of deterministic test patterns generally designated by the reference character 600 generated in this manner with the no invert, all invert, and nth bit functions.

As indicated at a block 410, a third embodiment utilizing a software Pseudo Random Pattern Generator (PRPG) to generate these deterministic test patterns 134. No fault simulation is necessary due to the observation and diagnostic technique. Random data from the PRPG is applied to the scan chains as well as into the Primary inputs. These values would then be captured with appropriate clocking into the shift register latch. The scan chain would then be unloaded and resolution to where the defect occurs can be determined.

A fourth embodiment, which is probably the most powerful, fully incorporates the perturbation function in conjunction with a small set of base deterministic patterns 134 to be resident on-chip. This BIST form and method of deterministic test pattern generation can thereby solely generate these diagnostic test patters on-chip without any external test system support, and can be a supplemental BIST support function (DFT). One hardware implementation on-chip, for example, consists of a memory that stores these base deterministic test patterns 502 and then is multiplexed with Exclusive-OR (XOR) 506 and perturbation logic circuitry 504, including, for example, no invert, all invert, nth bit invert, rotate, invert rotate, and the like, for every scan chain input to perturb the input pattern.

In all cases, the concept is to apply deterministic test patterns in a system mode, where the data values are laterally inserted into the latches of the scan chains utilizing all potential system functional paths and all system clocks on the product. Minimal, if any, test generation is required.

The generated deterministic test pattern is loaded into the scan chains as indicated at a block 412 and then system clocks C1 CLK and C2 CLK are applied as indicated at a block 414. The scan chains are unloaded as indicated at a block 416. A last switching latch is identified as indicated at a block 418. After these steps are repeated N times as indicated at a decision block 420, then checking for consistent results is performed as indicated at a decision block 422. If the results are consistent, then the identified last switching latch is sent to a Physical Failure Analysis (PFA) to localize the physical defect as indicated at a block 424. When the results are not consistent, then another deterministic test pattern is applied as indicated at a block 426. Then the exemplary steps are repeated.

In brief, the method of the invention is very valuable in diagnosing broken scan chains, especially for VLSI designs not containing BIST structures which prior art methods and techniques rely upon to solve this problem. These BIST-based methods are also not always 100% successful due to the nature of the defect or rather simply, not sufficient to expose/sensitize the actual defect mechanism causing the broken scan chain. In addition, this concept is very powerful in certain situations where either the BIST structures themselves are defective and/or do not propagate to certain sections of combinational logic, or arrays/memory that feed the latches of interest within the broken scan chain(s). The method of the invention is primarily independent of design type, with no LBIST, ABIST, DFT, and DFD structures required, other than being LSSD compliant.

The method of the invention is superior to other methods because it provides an efficient and unique solution to the stuck-at or broken scan chain diagnostics within a Deterministic environment with the following benefits. Rapid on-the-fly diagnosis is provided and defective latch is located with high probability. The method of the invention is compatible with existing non-BIST designs (ASICs) and is compatible with existing structural LSSD, and BIST designs. The method of the invention eliminates extensive test result data collection and implementation is relatively simple. The method of the invention is easily simplified and automated for manufacturing test. The method of the invention provides a quick and direct path from the computer test system 100 to Physical Failure Analysis. The method of the invention can be an on-chip hardware implementation for use as a BIST support function and DFD features. Fault simulation is not required with the method of the invention.

Furthermore, the method of the invention is highly effective when diagnosing un-modeled faults, AC defects, and intermittent fails that do not conform to the classical or conventional stuck-at or transitional fault models. Also, many of the underlying basic concepts can be generalized and integrated into general-purpose automated test generation and diagnostic products.

Figure 7:
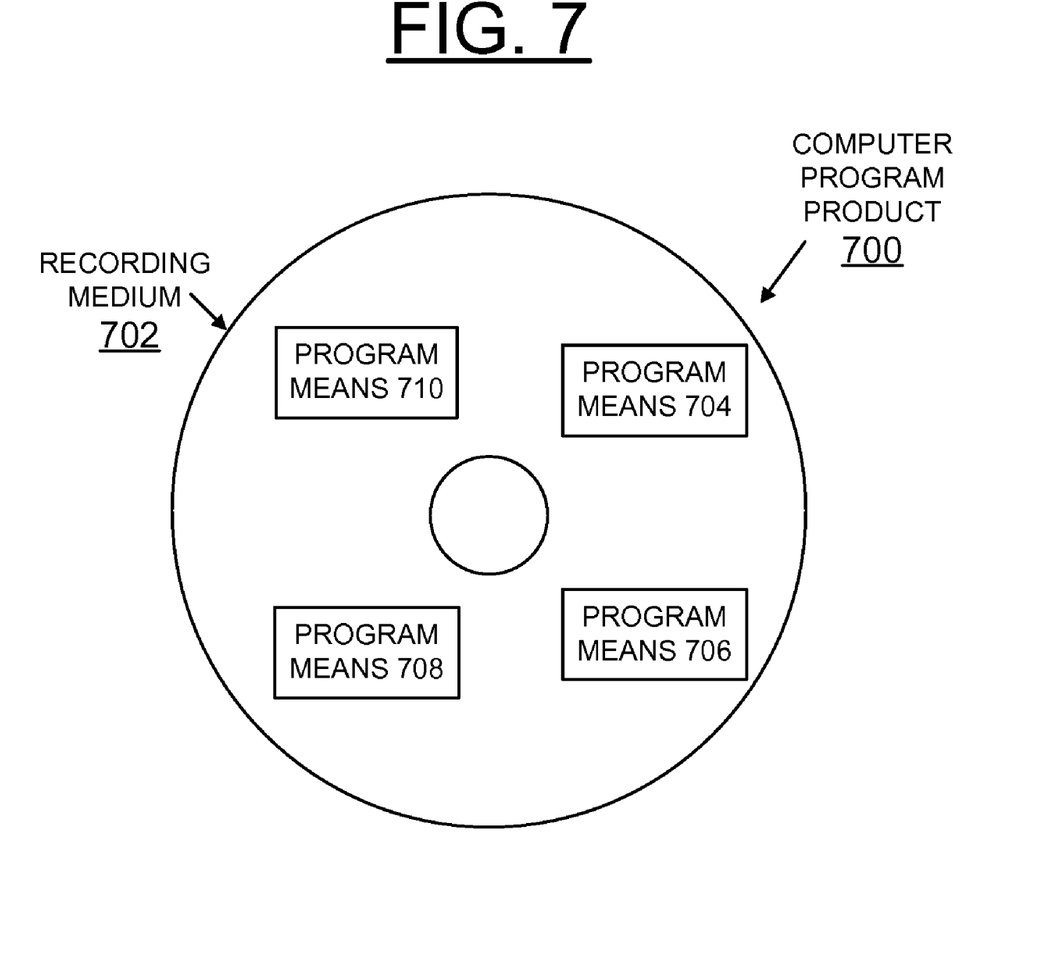
FIG. 7 is a block diagram illustrating a computer program product in accordance with the preferred embodiment.

Referring now to FIG. 7, an article of manufacture or a computer program product 700 of the invention is illustrated. The computer program product 700 includes a recording medium 702, such as, a floppy disk, a high capacity read only memory in the form of an optically read compact disk or CD-ROM, a tape, a transmission type media such as a digital or analog communications link, or a similar computer program product. Recording medium 702 stores program means 704, 706, 708, 710 on the medium 702 for carrying out the methods for implementing deterministic based broken scan chain diagnostics of the preferred embodiment in the computer test system 100 of FIG. 1.

A sequence of program instructions or a logical assembly of one or more interrelated modules defined by the recorded program means 704, 706, 708, 710, direct the computer system 100 for implementing deterministic based broken scan chain diagnostics of the preferred embodiment.

While the present invention has been described with reference to the details of the embodiments of the invention shown in the drawing, these details are not intended to limit the scope of the invention as claimed in the appended claims.

What is claimed is:

1. Apparatus for implementing deterministic based broken scan chain diagnostics in a computer test system connected to a Physical Failure Analysis system comprising:
    a set of deterministic test patterns; said set of deterministic test patterns being generated using a base deterministic test pattern set generated by an Automatic Test Pattern Generation (ATPG) system in a computer test system; each of the deterministic test pattern being a predetermined Level Sensitive Scan Design (LSSD) pattern:
    a test control program utilizing all potential system functional paths and all system clocks on a device under test, loading a deterministic test pattern into each scan chain in the device under test in a system mode using lateral insertion of respective deterministic values of the deterministic test pattern into each of a plurality of latches of each said scan chain via system data ports and applying system clocks to capture the respective deterministic values in each of the plurality of latches of each said scan chain; unloading each scan chain and identifying a last switching latch in each scan chain; repeating the generating, loading, unloading and identifying a last switching latch in each said scan chain testing steps a selected number of times with the deterministic test pattern; and checking for consistent results of the identified last switching latch in each scan chain and responsive to consistent results being identified, sending the identified last switching latch in each scan chain to said Physical Failure Analysis system to localize a physical defect; and responsive to consistent results not being identified, selecting another deterministic test pattern.

2. Apparatus for implementing deterministic based broken scan chain diagnostics as recited in claim 1 wherein said set of deterministic test patterns includes perturbations of one base deterministic test pattern from said base deterministic test pattern set generated by said Automatic Test Pattern Generation (ATPG) system.

3. Apparatus for implementing deterministic based broken scan chain diagnostics as recited in claim 2 wherein said perturbations of one base deterministic test pattern is generated by applying said one base deterministic test pattern from the base deterministic test pattern set to an exclusive OR and multiplexing a selected perturbation matrix entry using said exclusive OR.

4. Apparatus for implementing deterministic based broken scan chain diagnostics as recited in claim 3 includes a perturbation matrix having a plurality of perturbation matrix entries including selected ones of no invert, all invert, a predefined bit invert; rotate, and invert rotate.

5. Apparatus for implementing deterministic based broken scan chain diagnostics as recited in claim 1 wherein said set of deterministic test patterns includes a software Pseudo Random Pattern Generator (PRPG) for generating a deterministic test pattern.

6. A computer program product for implementing deterministic based broken scan chain diagnostics of a device under test in a computer test system connected to a Physical Failure Analysis system, said computer program product including instructions stored on a computer recording medium consisting one of a floppy disk, an optically read compact disk, a compact disk read only memory (CD-ROM), and a tape, wherein said instructions, when executed by the computer test system to cause the computer system to perform the steps of:
    generating a deterministic test pattern using a base deterministic test pattern set generated by an Automatic Test Pattern Generation (ATPG) system; the deterministic test pattern being a predetermined Level Sensitive Scan Design (LSSD) pattern;
    utilizing all potential system functional paths and all system clocks on a device under test, loading the deterministic test pattern into each scan chain in the device under test in a system mode using lateral insertion of respective deterministic values of the deterministic test pattern into each of a plurality of latches of each said scan chain via system data ports and applying system clocks to capture the respective deterministic values in each of the plurality of latches of each said scan chain;
    unloading each scan chain and identifying a last switching latch in each scan chain;
    repeating the generating, loading, unloading and identifying a last switching latch in each said scan chain testing steps a selected number of times with the deterministic test pattern;
    checking for consistent results of the identified last switching latch in each scan chain; and responsive to consistent results being identified with the deterministic test pattern, sending the identified last switching latch in each scan chain to said Physical Failure Analysis system to localize a physical defect; and
    responsive to consistent results not being identified, selecting another deterministic test pattern.

7. A computer program product for implementing deterministic based broken scan chain diagnostics as recited in claim 6 includes the steps responsive to consistent results not being identified, repeating the generating, loading, unloading and identifying a last switching latch in each said scan chain testing steps a selected number of times with the selected deterministic test pattern.

* * * * *